United States Patent [19]

Talley

[11] Patent Number: 5,301,156
[45] Date of Patent: Apr. 5, 1994

[54] CONFIGURABLE SELF-TEST FOR EMBEDDED RAMS

[75] Inventor: Harlan A. Talley, Fort Collins, Colo.

[73] Assignee: Hewlett-Packard Company, Palo Alto, Calif.

[21] Appl. No.: 732,538

[22] Filed: Jul. 18, 1991

[51] Int. Cl.⁵ ............................................. G11C 7/00
[52] U.S. Cl. ............................... 365/201; 371/22.3; 371/22.4; 371/22.5
[58] Field of Search .............. 365/201; 371/21.1, 22.4, 371/22.3, 22.5, 22.6

[56] References Cited

U.S. PATENT DOCUMENTS

| | | | |
|---|---|---|---|
| 4,601,034 | 7/1986 | Sridhar | 371/22.4 |
| 4,827,476 | 5/1989 | Garcia | 371/22.3 |
| 4,918,378 | 4/1990 | Katircioglu et al. | 365/201 |
| 5,006,787 | 4/1991 | Katircioglu et al. | 371/22.4 |

OTHER PUBLICATIONS

Dekker, R., et al. "Realistic Built-in Self-test for Static RAMs," *IEEE Design & Test of Computers,* Feb. 1989, pp. 26–354, (IEEE Order No. 0740-7475/89/0-02-26$1.00).

Hassan, S., et al., "Parallel Signature Analyzers-Detection Capability and Extensions," Apr. 1983, (IEEE order number 4/83/0000-0440$1.00).

Frowerk, R., "Signature Analysis: A New Digital Field Service Method," Hewlett Packard Journal, 1977.

Dekker, R., et al. "Fault Modeling and Test Algorighm Development for Static Random Access Memories," *Proc. IEEE Int'l Test Conf.,* Sep. 1988, pp. 343–352 (IEEE Order No. CH2610-45/88/0000/0343$01.00).

Primary Examiner—Robert J. Pascal
Assistant Examiner—Tan Dinh
Attorney, Agent, or Firm—Guy J. Kelley

[57] ABSTRACT

A configurable self-test circuit for a RAM embedded in an integrated circuit chip comprises an incrementable address register, a configurable control circuit, a write register, a signature generator, and a scanpath. The address register stores the current RAM address to be accessed and is adapted to automatically increment the RAM address by an address increment upon receiving an increment signal. The configurable control circuit has a normal operation mode and three test modes wherein all writes, all reads or alternating writes and reads are performed. The write register stores data patterns which are to be written to the RAM under test. The signature generator receives data read from the RAM and produces a unique signature in response thereto. A scanpath through the address register, control circuit, write register, and signature generator allows test vectors to be serially shifted in and test data to be shifted out of these devices. A full functional test is performed of the RAM. A special test checks the functioning of the pull-up FETs in each RAM cell.

12 Claims, 9 Drawing Sheets

CONFIGURABLE SELF-TEST FOR EMBEDDED RAMS

BACKGROUND OF THE INVENTION

1. Field of the Invention

This invention relates generally to the art of in-circuit testing of RAMs. More specifically, the invention relates to scanpath testing of RAMs embedded on VLSI chips.

2. Related Art

The dense integration (VLSI) of logic on a single silicon microchip has created immense problems for the test engineer. In order manage functional testing of such complex circuitry, the VLSI chip must be divided into independently testable blocks. A RAM is one such block.

Although the structure of the RAM is simple, it is difficult to test because it is sequential, each address is uniquely addressable, and the RAM is susceptible to a variety of fault conditions, each requiring a unique test. In the past, three approaches have been used to test these embedded RAMs. Each has significant advantages and disadvantages.

Small embedded RAMs can be tested using normal scanpath testing. Scanpath testing involves interfacing the chip with a RAM tester, and then serially shifting an address, data, and control information into and out of the chip for each RAM address to be tested. Each address requires a shift in, shift out operation.

This conventional scanpath approach is straightforward and very flexible. Test patterns are easily changed in the tester prior to being shifted into the RAM, and when unexpected failure mechanisms are discovered, the scanpath can be used to access specific RAM addresses such that special tests can be performed to provide detailed diagnostics. Also, a minimal amount of additional chip hardware is required if a scanpath and diagnostic interface port (DIP) are already resident on the chip.

The main disadvantage of normal scanpath testing is that it is time intensive due to the fact that each address requires a shift in, shift out operation, and each shift in, shift out operation may require several hundred clock cycles. For large embedded RAMs, this can make testing painfully slow.

Another disadvantage of normal scanpath testing is that it is impossible to read or write to a sequence of addresses at full speed, since a new address, possibly new write data, and new control bits must be serially shifted (i.e., scanned) in for each address.

A second test approach for the embedded RAM is to make all RAM signals (i.e., all address lines and data lines) available at the pads of the microchip. This allows the tester to have complete and direct control over the RAM.

While this is ideal from a test standpoint, making all RAM signals externally accessible requires additional signal routing to bring the signals to the periphery of the chip. In addition, multiplexing circuitry is often required such that pads may be shared. A significant increase in chip area results from the additional hardware.

A further disadvantage of directly testing in this manner is that the test equipment must directly create all test patterns. This requires a special test pattern generator or a tester with a very large amount of vector memory.

A third test approach is the self-test. Conventional (hardware-based) self-tests generally use a dedicated controller (i.e., a dedicated state machine such as a programmable logic array) and a data pattern generator which together generate test patterns and then cycle the RAM through a predefined sequence of operations. Such a test has the advantage that it can be run at full speed with a minimum of special hardware or software in the tester.

An example of a convention RAM self-test circuit is given in R. Dekker, et al., "Realistic Built-in Self-test for Embedded RAMs," *IEEE Design & Test of Computers*, 1989, pages 26–34, (IEEE order no. 0740-7475/89/0002-26$1.00).

The self-test suffers from the disadvantage that a large amount of on-chip hardware may be required to create the dedicated controller and the data pattern generator. Further, conventional self-tests provide only pass/fail results such that it may not be possible to obtain more detailed diagnostics. In addition, since the test sequence is fixed in hardware, the sequence cannot be modified without modifying the chip. This inflexibility poses a significant problem when unexpected failure mechanisms, which require new tests, are discovered after manufacture of the chip.

A further shortcoming of self-test is that the dedicated controller normally supplies its control signals to the RAM over a distinct control path such that the regular control path is not tested.

It is an object of the present invention to overcome the deficiencies of these known test methods by providing a flexible, efficient test system and method that can be run at full speed, will provide detailed diagnostics, and will fully test an embedded RAM.

SUMMARY OF THE INVENTION

A configurable self-test circuit and method for testing a RAM embedded in an integrated circuit chip merges the speed of a conventional self-test with the flexibility of direct scanpath testing to produce a superior RAM test.

The dedicated state machine of the conventional self-test circuit is replaced with a controller that can be configured through a scanpath. The data generator of the self-test circuit is replaced with a scannable write register. A signature generator is used to compile the test results.

The configurable self-test circuit comprises an incrementable address register, a configurable control circuit, a write register, a signature generator, and a scanpath. The address register stores the current RAM address to be accessed and is adapted to automatically increment the RAM address by an address increment upon receiving a clock signal. The control circuit has a normal operation mode and three test modes wherein all writes, all reads or alternating writes and reads may be performed.

The write register stores data patterns which are to be written to the RAM under test. The signature generator receives data read from the RAM and produces a unique signature. A scanpath through the address register, control circuit, write register, and signature generator allows data to be serially shifted in or out of these devices. A full functional test is performed on the RAM.

A special test checks the functioning of the pull-up FETs in each RAM cell. To perform the test, a leak FET is added to each bit and NOT-bit line of the RAM to discharge parasitic capacitances so that false HIGH's can be eliminated.

PREFERRED EMBODIMENT OF THE PRESENT INVENTION

The preferred embodiment of the present invention is now described with reference to the figures, where like reference numbers indicate like elements. Where logical signals are discussed, a logical HIGH is a TRUE signal and may refer to either a binary "1" or a binary "0" depending on whether the logic used is negative true logic or positive true logic. Similarly, a logical LOW is a FALSE signal and may refer to either a binary "1" or a binary "0" depending on whether the logic used is negative true logic or positive true logic.

Figure 1:
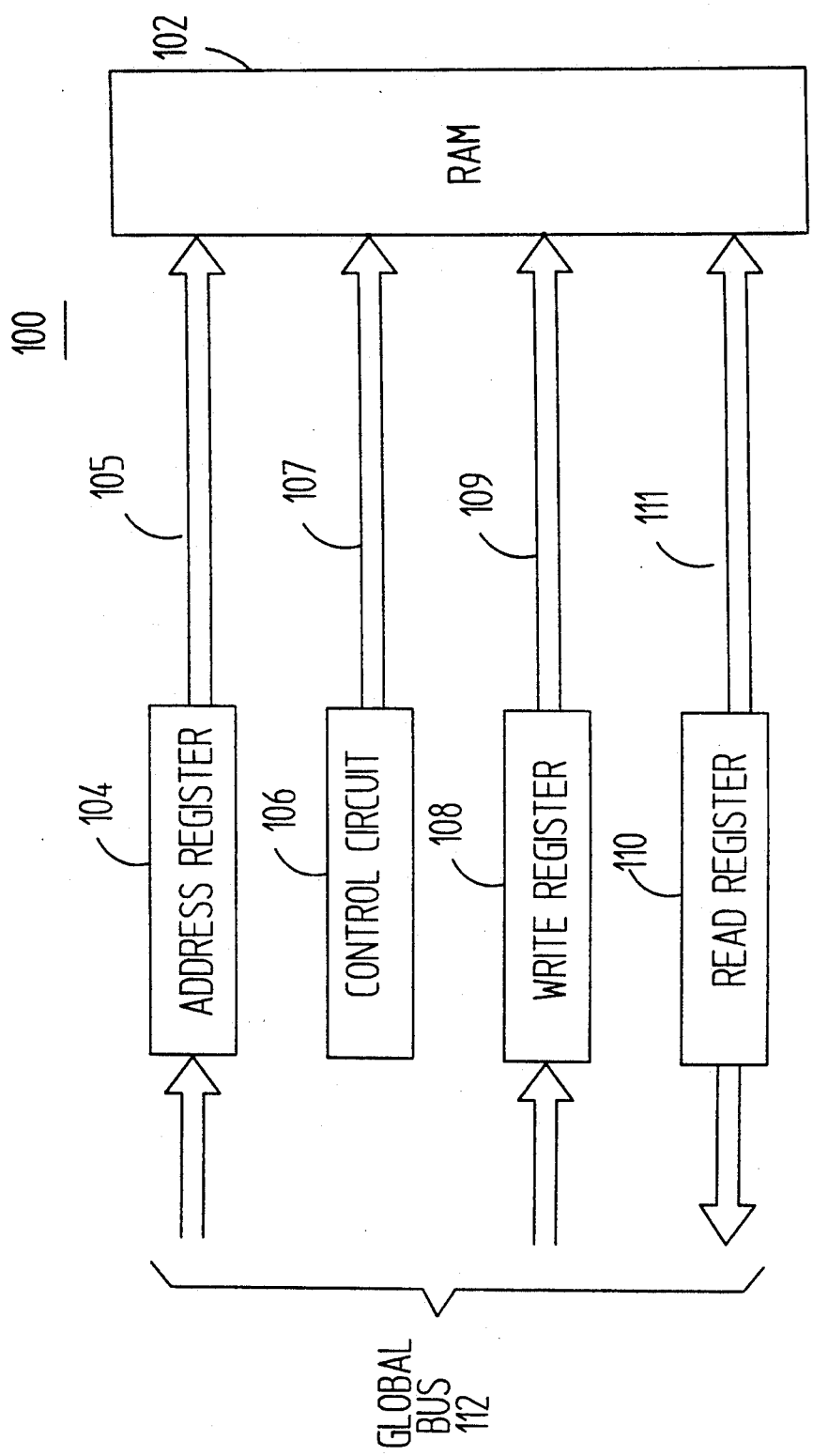
FIG. 1 is a block diagram of a typical RAM circuit with associated registers.

A block diagram of an embedded RAM (Random Access Memory) circuit 100 is shown in FIG. 1. Embedded RAM 100 includes RAM 102, an address register 104, a control circuit 106, a write register 108, and a read register 110. RAM 102 includes read and write latches, and address and control logic, in addition to the RAM memory cells.

Address register 105 is a register somewhere in the data path of the chip which provides address information to RAM 102 via an address bus 105. Control circuit 106 provides control information to the internal logic of RAM 102 via control bus 107. In addition, control circuit 106 controls address register 104, write register 108, and read register 110. Control circuit 106 is the controller for the VLSI chip and is normally a programmable logic array (PLA). Write register 108 provides data which is to be written to RAM 102 via a write bus 109. Read register 110 accepts data from RAM 102 over a read bus 111.

Address register 104, write register 108, and read register 110 are each connected to a global bus 112.

If a functional test is to be performed on RAM 102, then it must be isolated from its environment, and the test equipment must have access to address bus 105, control bus 107, write bus 109, and read bus 111.

Figure 2:
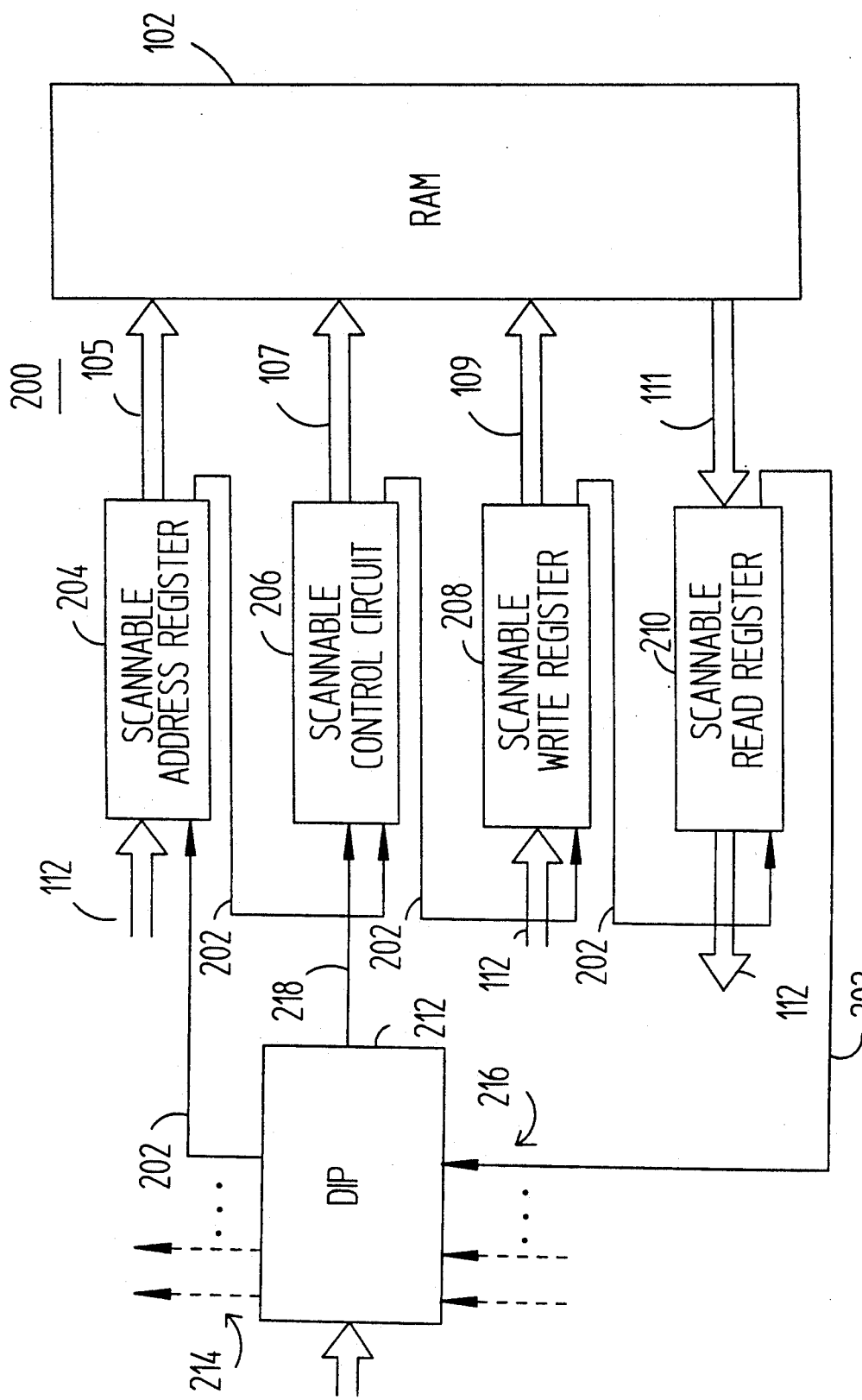
FIG. 2 is a block diagram of a conventional scannable RAM test circuit.

FIG. 2 shows a conventional scannable RAM circuit 200 required to implement normal scanpath testing. Scannable RAM circuit 200 gains test access to RAM 102 using scannable register cells. Note that address register 104 is replaced with a scannable address register 204. Control circuit 106 is replaced with a scannable control circuit 206. Write register 108 is replaced with a scannable write register 208. Read register 110 is replaced with a scannable read register 210.

A "scannable" device is a device which can be serially loaded. More specifically, the scannable device is designed with shift registers placed between input/output terminals and the internal logic such that any desired bit pattern can be caused to appear at the normal outputs of the device. When these shift registers are connected together, they form a data register chain known as a scanpath. Scanpaths are well known in the art.

It will be understood by one skilled in the art that "scannable" also refers to a device which is not inherently scannable, but is connected to a scannable register such that the contents of the scannable register can be dumped into the non-scannable device. This allows any device to be included in a scanpath so long as it is associated with a scannable register.

Scannable address register 204, scannable control circuit 206, scannable write register 208, and scannable read register 210 are connected together to form a scanpath 202.

A diagnostic interface port (DIP) 214 allows communication with scanpath 202. DIP 214 is also known as a debug port. DIP 214 is a serial communication port which includes multiplexers and control logic which allow a user to selectively shift data into any one of a plurality of scanpaths. The heads 214 and tails 216 of various scanpaths (e.g., scanpath 202) are shown interfacing with DIP 212.

DIP 212 provides a control signal to scannable control circuit 206 over mode line 218. The control signal enables alternately selecting either normal operation or test mode for circuit 200.

Scannable RAM circuit 200 operates as follows. RAM test mode is selected via mode line 218. A test vector is then serially shifted in from a tester and into scanpath 202 through DIP 212. Each test vector contains a RAM address (for address register 204) and control information (for control circuit 206). If a write operation is to be performed, then the test vector will also contain a test pattern (for write register 208) which is to be written to the selected RAM address.

Once the test vector is shifted into position via scanpath 202, then a clock pulse is supplied to the chip from the tester, and control circuit 206 is cycled. If a read is performed, then the contents of the selected address of RAM 102 will be loaded into read register 210. Similarly, if a write is performed, then the contents of write register 208 will be written to the selected address of RAM 102.

After a read operation is performed, the contents of the read register may be shifted out for comparison to an expected value in the tester. A next test vector is then shifted in and the cycle is repeated.

Note that this test method requires serially shifting a test vector into the RAM circuit for each read or write operation to be performed. This results in a time intensive test approach which can be impractical for large embedded RAMs (e.g., larger than 16 Kb).

Figure 3:
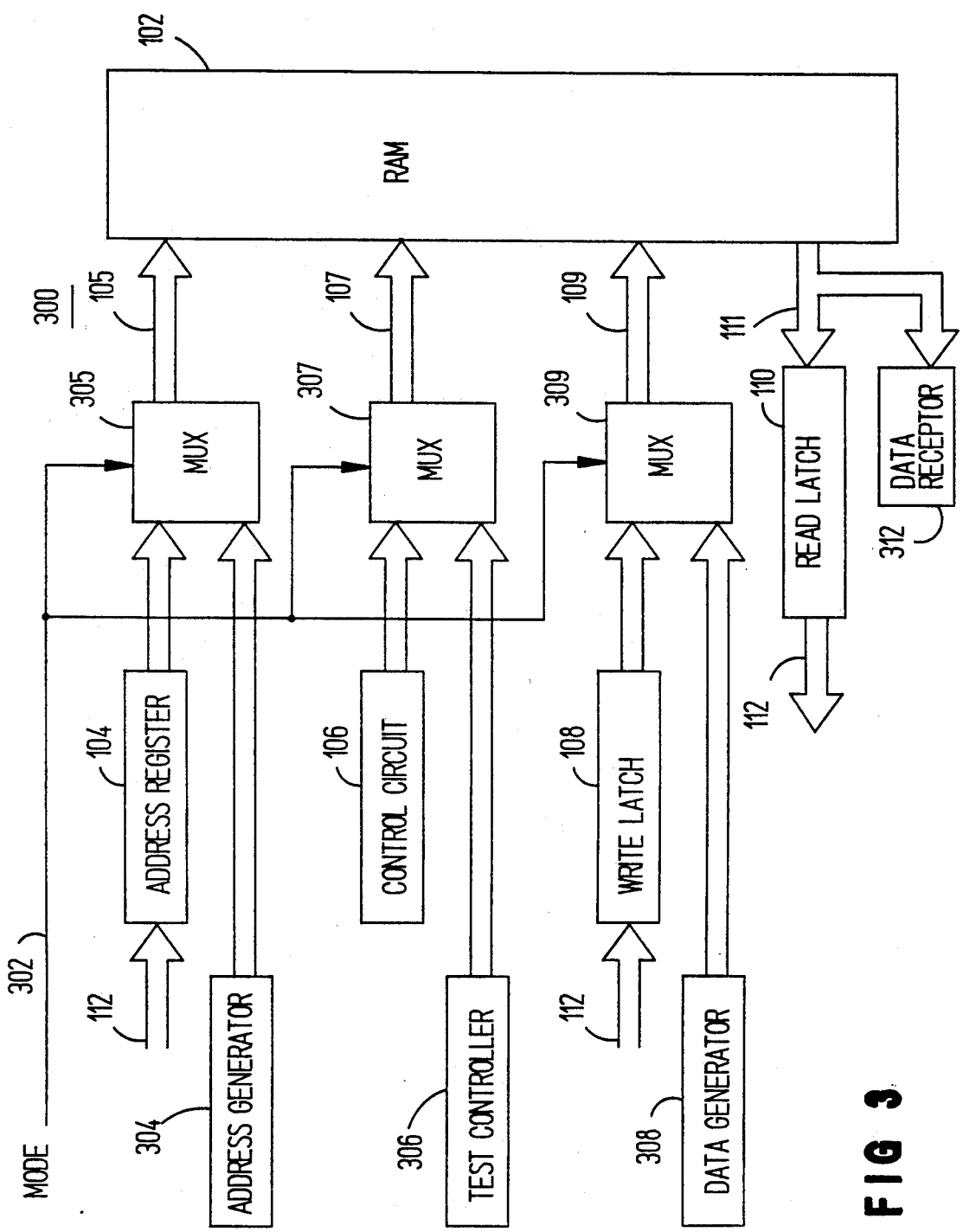
FIG. 3 is a block diagram of a conventional RAM self-test circuit.

An alternate test approach which tests at speed and does not require a large amount of tester memory is shown in FIG. 3. A conventional RAM self-test circuit 300 includes address register 104, control circuit 106, write register 108, and read register 110 as in RAM circuit 100. In addition, RAM self-test circuit 300 includes an address generator 304, a test controller 306, and a data generator 308 which are used to control and sequence RAM 102 through a test. Address register 104 and address generator 304 are connected to MUX (multiplexer) 305. MUX 305 is adapted to selectively connect either address register 104 or address generator 304 to RAM 102 via address bus 105.

Control circuit 106 and test controller 306 are connected to MUX (multiplexer) 307. MUX 307 is adapted to selectively connect either control circuit 106 or test controller 306 to RAM 102 via control bus 107.

Write register 108 and data generator 308 are connected to MUX (multiplexer) 307. MUX 309 is adapted to selectively connect either write register 108 or data generator 308 to RAM 102 via write bus 109.

Operation of circuit 300 is as follows. MUX's 305, 307, and 309 are controlled by a mode line 302. Mode line 302 is used to select either normal operation of circuit 300 or test mode. During normal operation, address register 104, control circuit 106, and write register 108 are connected to RAM 102, and the VLSI chip operates normally. If test mode is selected, however, MUX 305 will connect address generator 304 to RAM 102, MUX 307 will connect test controller 306 to RAM 102, and MUX 309 will connect data generator 308 to RAM 102.

Address generator 304, test controller 306, and data generator 308 form a dedicated state machine which generates test patterns and cycles RAM 102 through a predefined sequence of read/write operations. A data receptor 312 is connected to read bus 111. Data receptor 312 accepts the data produced by RAM 102 during read operations and either compares the data to expected results or stores the data for later comparison.

As discussed above, this self-test approach suffers from the disadvantage that a large amount of on-chip hardware is required to create dedicated test controller 306 and data generator 308. Further, this test approach will provide only pass/fail results, and the test sequence is fixed in hardware such that it cannot be modified without modifying the chip. Also, note that the normal control path is not tested.

The present invention benefits from the advantages of both scanpath testing and self-test by providing for a configurable self-test. The configurable self-test combines the flexibility of a direct scanpath test with the speed of a conventional self-test by:

(1) replacing the hardware state machine (i.e., test controller 306) of RAM self-test circuit 300 with a configurable controller (i.e., configurable control circuit 406) that can be configured through a scanpath 402;

(2) replacing data generator 308 of RAM self-test circuit 300 with a write data register 208 which can also be loaded through a scanpath;

(3) replacing address generator 304 of RAM self-test circuit 300 with an incrementable address register 404 that can be loaded through a scanpath 402; and (4) using a signature generator 408 to compile the test results.

Figure 4:
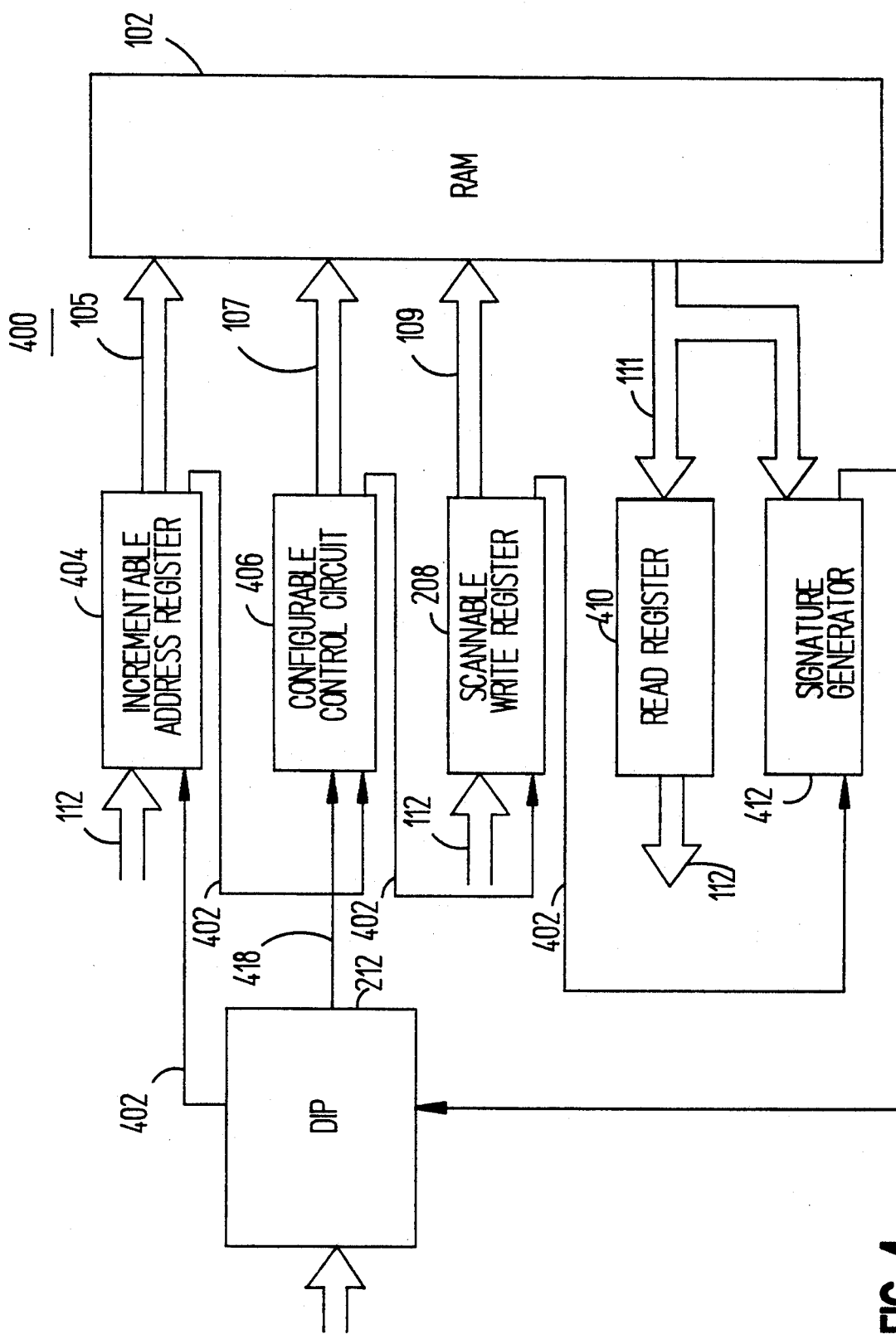
FIG. 4 is a block diagram of the configurable self-test circuit according to the present invention.

Configurable self-test circuit 400 of the present invention is now described with reference to FIG. 4. Configurable self-test circuit 400 is similar to scannable RAM circuit 200. Note, however, that address register 204 is replaced with an incrementable address register 404. Scannable control circuit 206 is replaced with a configurable control circuit 406. Read register 210 is replaced with read register 410. A signature generator 412 is connected to read bus 111.

A scanpath 402 through (or allowing access to) incrementable address register 404, configurable control circuit 406, write register 208, and signature generator 412 is connected to DIP 212.

DIP 212 further provides a two-bit control signal to configurable control circuit 406 via a mode bus 418. The control signal enables selecting either normal operation or one of several test modes for circuit 400.

Specifically, configurable control circuit 406 is configured via two mode bits (i.e., mode bit [0] and mode bit [1]) from the two control lines of mode bus 418. These two lines allow the tester to select from among four modes of operation: (1) normal operation, (2) test-read on every clock cycle, (3) test-write on every clock cycle, and (4) test-alternating reads and writes.

As with normal scanpath testing, circuit 400 does not require a dedicated controller. Thus, in its normal mode of operation, configurable control circuit 406 is the chip's normal controller. The preferred controller is a PLA. The logic for configurable control circuit 406 may be any state machine which can do the following for a specified number of cycles:

(1) read and then increment the address in incrementable address register 404 every cycle;

(2) write and then increment the address in incrementable address register 404 every cycle; and (3) write then read (or read then write), with an increment of the address in incrementable address register 404 every other cycle.

Figure 5:
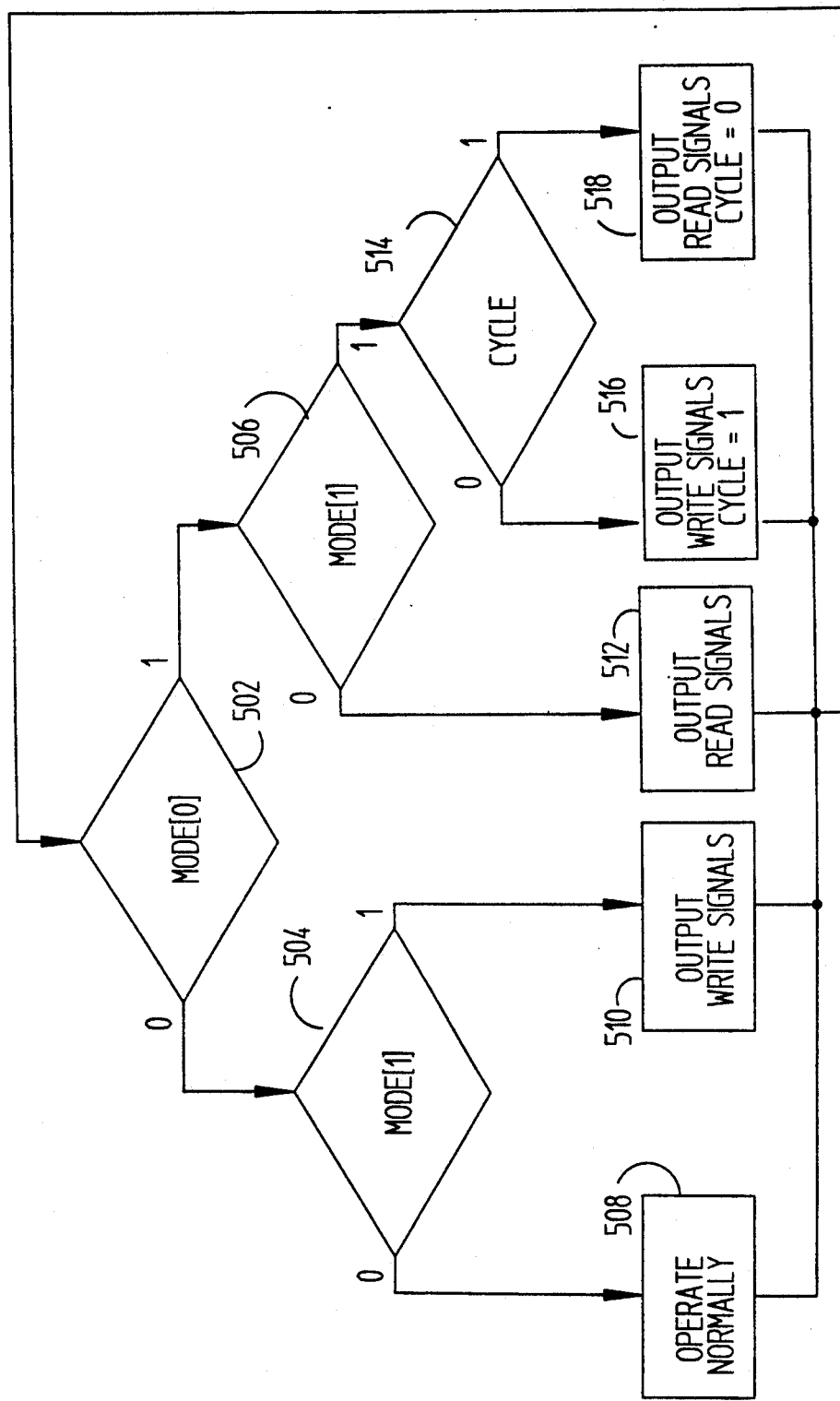
FIG. 5 is a state diagram for configurable control circuit 406.

A state diagram for control circuit 406 is shown in FIG. 5. At step 502 mode bit [0] is checked. At steps 504 and 506, mode bit [1] is checked. If mode bit [0] is LOW and mode bit [1] is LOW, then control circuit 406 operates normally (i.e., not test mode) at step 508. If mode bit [0] is LOW and mode bit [1] is HIGH, then control circuit 406 outputs write signals at step 510.

If mode bit [0] is HIGH and mode bit [1] is LOW, then control circuit 406 outputs read signals at step 512. If mode bit [0] is HIGH and mode bit [1] is HIGH, then a CYCLE flag is checked at step 514. If the CYCLE flag is LOW, then control circuit 406 outputs write signals at step 516 and sets the CYCLE flag HIGH. If the CYCLE flag is HIGH, then control circuit 406 outputs read signals at step 518 and sets the CYCLE flag LOW.

Incrementable address register 404 is a scannable register. In addition, register 404 is incrementable. That is, register 404 can be automatically incremented by a predetermined amount in either the positive or negative direction. Further, the increment can occur on every clock cycle or every other clock cycle depending on the control pattern loaded into control circuit 406.

Figure 6:
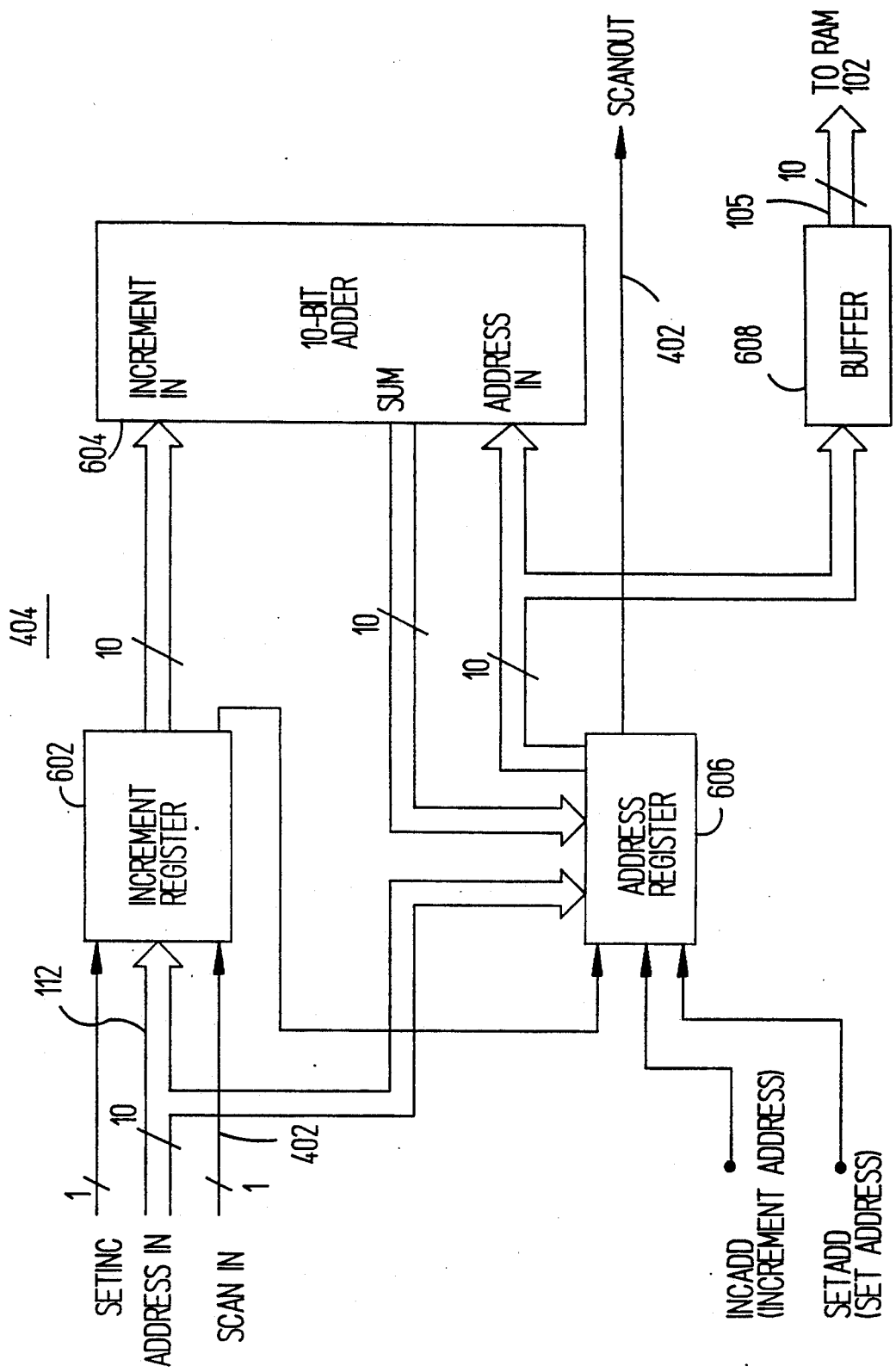
FIG. 6 is a block diagram of incrementable address register 404.

Incrementable address register 404 is shown in greater detail in FIG. 6. Register 605 includes an increment register 602, an adder 604, an address register 606, and a buffer 608.

Increment register 602 is provided to store the address increment. Increment register 602 has a scanpath input, an address input from global bus 112, and a SETINC (Set Increment) input. A logical HIGH on the SETINC input will cause an address increment on global bus 112 to be loaded into increment register 602. Similarly, increment register 602 may be loaded serially via scanpath 402.

Increment register 402 provides an address increment to a first input of adder 604. A second input of adder 604 is connected to an output of address register 606. Adder 604 adds these two addresses to produce an incremented address.

Address register 606 has a scanpath input, an address input from global bus 112, an address input from adder 604, an INCADD (Increment Address) input, and a SETADD (Set Address) input. A logical HIGH on the INCADD input causes the incremented address from adder 604 to be loaded as the present address. A logical HIGH on the SETADD input causes the address from global bus 112 to be loaded into address register 606. Address register 606 outputs its current address to RAM 102 over address bus 105. A buffer 608 drives address bus 105.

Note that incrementable address register 404 may be decremented by addition with a two's complement increment such that a dedicated decrement (i.e., count down) feature is not required.

In the preferred embodiment of the invention, RAM 102 has an 8-bit address word size. Note, however, increment register 602, adder 604, and address register 606 are 10-bit devices. The 10-bit address word size is used to allow configurable self-test circuit 400 to address more than one RAM 102. The two most significant bits of the 10-bit address word may be used as control bits to select between several RAMs.

Write register 208 is a standard scannable register as is known for scanpath testing.

In the preferred embodiment, read register 410 is a simple register located in a data path on the chip. It is not required to be scannable and is not included in scanpath 402. However, it may be scannable and may further be included in scanpath 402 if so desired.

Signature generator 412 is the only piece of hardware which has been added to the integrated circuit which is dedicated entirely to test. In the preferred embodiment, signature generator 412 is a parallel input polynomial signature analyzer which uses a series of linear feedback shift registers to produces a test signature. It should be understood, however, that any device which produces a single number (i.e., a signature) which is statistically related to the correctness of a stream of data may be used for signature generator 412. A parity generator is one such alternate device.

Polynomial signature analysis is a scheme of logically combining a series of bits in such a manner that statistically there is a very high probability that the logical combination will produce a unique test signature or end product. Since each data term input to the signature generator will effect the unique test signature, comparison with a predetermined, expected signature will indicate whether any data errors have occurred.

For a more detailed discussion of parallel signature analysis, see the following:

(1) S. Hassan, et al., "Parallel Signature Analyzers—Detection Capability and Extensions," April 1983, IEEE order number CH1856-4/83/0000-0440$1.00

(2) R. Frohwerk, "Signature Analysis: A New Digital Field Service Method," *Hewlett Packard Journal*, 1977.

Figure 7:
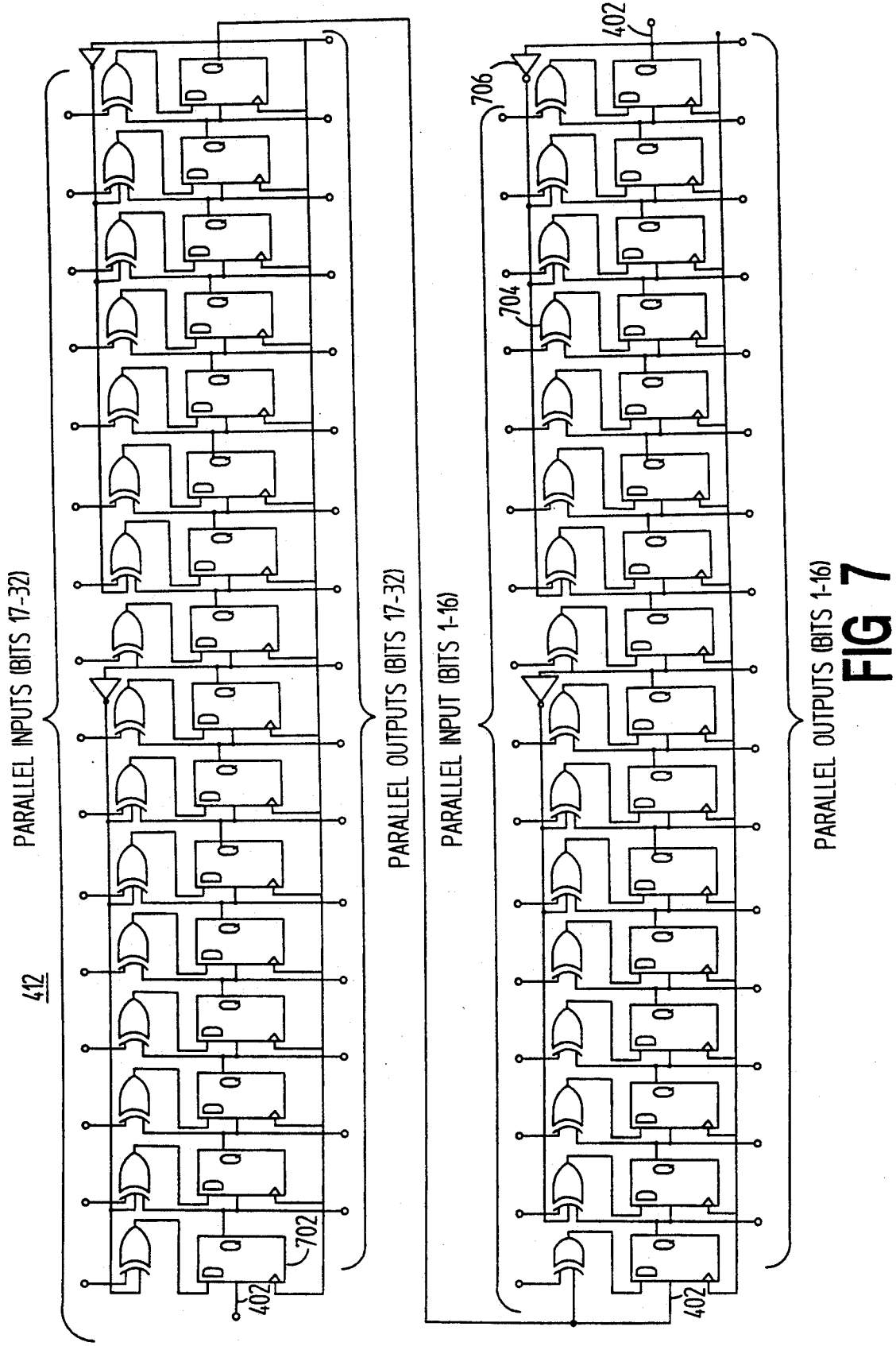
FIG. 7 is a schematic diagram of signature generator 412.

The preferred embodiment of signature generator 412 is shown in FIG. 7. Signature generator 412 is a 32-bit shift register which includes thirty-two D flip-flops 702, thirty-two exclusive-OR gates 704, and four inverters 706 connected as shown. Each D flip-flop 702 is a master-slave flip-flop which is scannable. This embodiment of signature generator 412 would be used with a 32-bit word size RAM.

Figure 8:
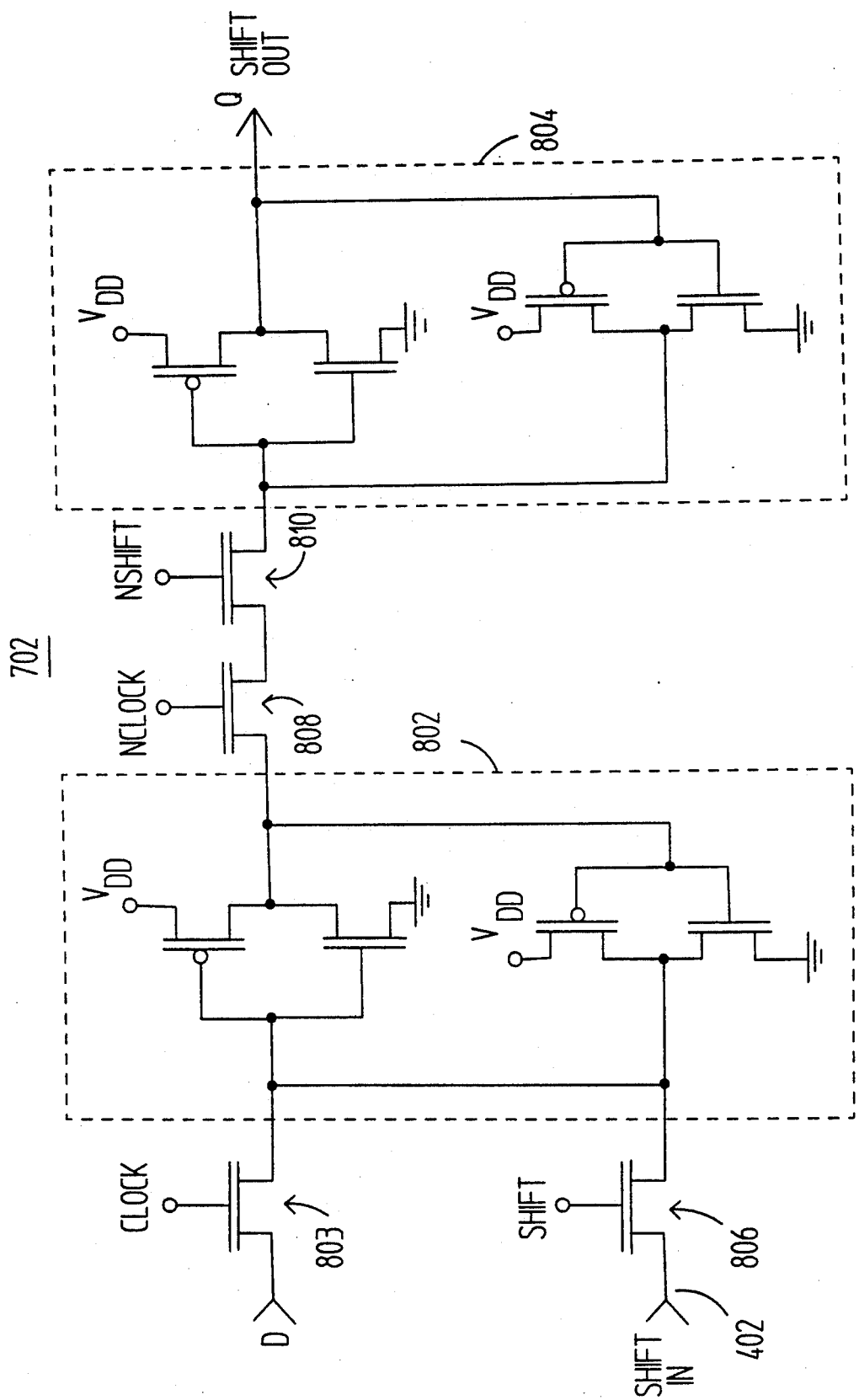
FIG. 8 is a schematic diagram of D flip-flop 702 of signature generator 412 illustrating the scanpath therethrough.

A detail of each D flip-flop 702 is shown in FIG. 8. D flip-flop 702 includes a master latch 802, a slave latch 804, and gating transistors 803, 806, 808, and 810. Transistor 803 is controlled by a CLOCK signal. Transistor 806 is controlled by a SHIFT signal. The SHIFT signal enables shifting data through signature generator 412 via scanpath 402. Transistor 808 is controlled by an inverted clock signal, NCLOCK. Transistor 810 is controlled by an inverted shift signal, NSHIFT. Note that a shift can only occur when CLOCK is LOW and NCLOCK is HIGH.

It will be understood by a person skilled in the art that signature generator 412 may be replaced with other data compilation devices such as an odd/even counter.

No modifications are necessary to DIP 212, as it already contains the hardware necessary to provide control bits and to control the duration (in clock cycles) of a test. In an alternate embodiment, wherein the chip does not have a diagnostic interface port (i.e., DIP 212 is not present), four pads may be added to the chip for the configurable self-test. These include two pads for scanpath 402 and two pads for mode bus 418.

Operation of configurable self-test circuit 400 is as follows. Test mode is selected by the tester via DIP 212 and mode bus 418. A test vector is then serially shifted in from the tester and into scanpath 402 through DIP 212. Each test vector contains a RAM address (for incrementable address register 404), a control pattern (for configurable control circuit 406), a test pattern (for write register 208), and an initializing signature (i.e., a zero pattern) to be written to polynomial signature generator 412. If desired, each test vector may also include an address increment.

It should be understood that a reset feature could be added to signature generator 412. This would eliminate the need to scan in an initializing signature.

Once the test vector is shifted into position via scanpath 402, then a clock signal is supplied to the chip from the tester and configurable control circuit 406 cycles through the entire RAM 102 performing a sequence of reads and writes as specified by the control pattern. As the test is running, polynomial signature generator 412 monitors and processes the data which is read back from RAM 102. Thereafter, a resulting test signature from signature generator 412 is scanned out via scanpath 402 and compared with an expected signature.

This process can be repeated with different patterns and read-write sequences to test for opens, shorts, capacitive coupling between memory cells, and bad RAM pre-chargers. Suitable test algorithms are disclosed in R. Dekker, et al., "Fault Modeling and Test Algorithm Development for Static Random Access Memories," *Proc. IEEE Int'l Test Conf.*, September 1988, pp. 343-352. In addition, a special test has been developed to verify the presence of the pull-up FETs (Field Effect Transistor) in the RAM cells.

Figure 9:
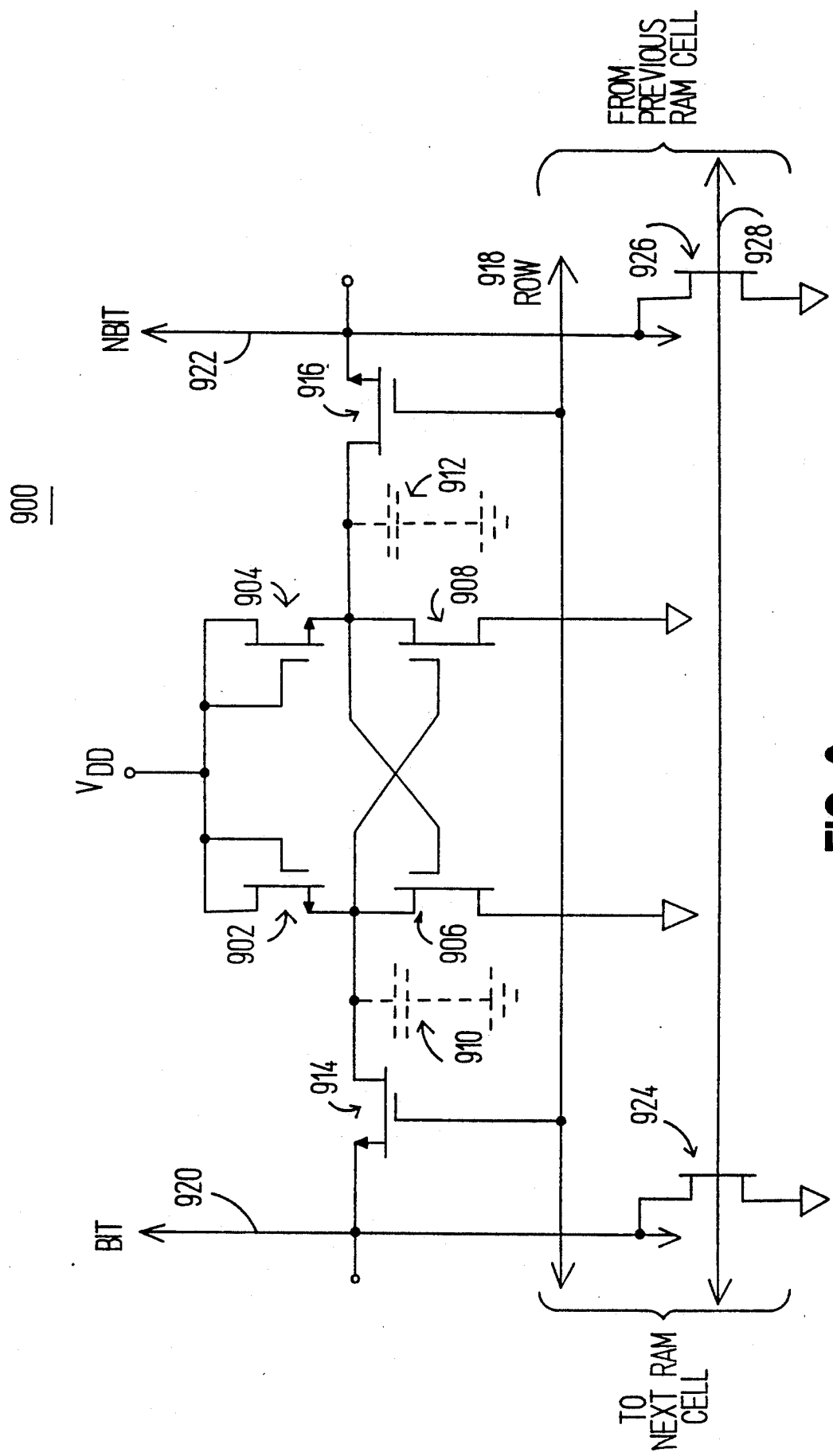
FIG. 9 is a schematic diagram of a static RAM cell configured for the novel pull-up FET test of the present invention.

A schematic diagram of a typical static RAM cell 900 is shown in FIG. 9. Cell 900 includes FETs 906 and 908, pull-up FETs 902 and 904, and row select FETs 914 and 916. Bit line 920 is connected to the source side of row select FET 914. Nbit (NOT-bit) line 922 is connected to the source side of FET 916. Row select line 918 is connected to the gates of row select FETs 914 and 916. Parasitic capacitors 910 and 912 are shown (in phantom) connected from the drain side of FETs 914 and 916 respectively.

A defective or missing pull-up FET (902 or 904) can be difficult to detect. This occurs because parasitic capacitors 910 and 912 may cause the cell to hold a HIGH value from the pre-charge cycle even in the absence of a properly functioning pull-up.

One traditional approach for testing the pull-up FETs was to pre-charge the RAM cell LOW and then let the pull-up FET pull the cell HIGH. This approach, however, produces unreliable results.

Another traditional approach involved pre-charging the RAM cell HIGH and then waiting an extended period of time to see if the parasitic capacitance would discharge. The major disadvantage of this approach is the long waiting period required for the discharge.

The present invention provides a novel test for the pull-up FETs. A leak FET 924 is added between bit line 920 and ground. A leak FET 926 is added between Nbit line 922 and ground. A leak FET control line 928 is connected to the bases of leak FETs 924 and 926. When a test of pull-up FETs 902 and 904 is to be performed, leak FETs 924 and 926 are turned ON by either configurable control circuit 406 or DIP 212 via control line 928. Thereby, parasitic capacitances 910 and 912 may be rapidly discharged to avoid a false HIGH condition in the presence of a missing or defective pull-up FET 902 or 904.

The pull-up FET test may be performed as follows. A leak FET is connected to each bit line and each NOT-bit line of the RAM. All of the leak FET's are controlled by a single line such that they may be turned ON simultaneously. Prior to the pull-up FET test, all leak FET's are turned ON. A logical HIGH is then written to the RAM address to be tested. The RAM address is then read back, with a HIGH expected. A logical LOW is then written to the RAM cell. Again, the RAM address is read back, with a LOW expected. After the test is completed for all desired addresses, the leak FET's are turned OFF.

The pull-up FET test is performed along with the other RAM functional tests (e.g., test for shorts, opens, bad prechargers, etc.), and the results may be scanned out (e.g., as a polynomial signature) in the same fashion.

A sample test sequence is now provided to illustrate operation of the invention. This test sequence could be used for a 32-bit word by 512 word RAM which is four words wide (row) and 128 bits high (column). This RAM would have thirty-two bit lines and thirty-two Nbit lines such that sixty-four leak FETs would have to added for the pull-up FET test.

Note that in certain portions of the test that the RAM address is stepped by four. This accounts for the fact that the RAM is four words wide and that every fourth address points to an adjacent cell in the next row. Stepping by four allows the tester to test for capacitive coupling, shorts, and other faults which can occur between adjacent memory cells.

In the test sequence, the following commands are defined. LOADINCREMENT loads an increment value into incrementable address register 404. LOADADDRESS loads a starting address into incrementable address register 404. LOADWRITELATCH loads a data pattern into write register 208. READSIG is the signature which is expected to be shifted out of signature generator 412 at the end of the test. WRITEREAD is a write to RAM 102 followed by an increment to the address in incrementable address register 404 and a read from RAM 102. The number following the WRITE-READ indicates the number of times the WRITE-READ (i.e., write-increment-read) is to be repeated.

CLEARSIG clears or resets the signature generator. The signature register is cleared prior to beginning each test. When this is done, the test signature will be a function of the test sequence, and not of any clocking done to load the other registers. As discussed above, this reset may be accomplished through a special function of the signature generator. If the reset is done in this manner, the scan to clear the signature generator may be eliminated.

The suggested test sequence is as follow:

WRITE ZERO TO ALL ADDRESSES loadincrement %000000001;
    loadaddress %000000000;
    loadwritelatch %00000000000000000000000000000000;
    clearsig;
    write 512;
    readsig% 10000011100111000011000001101011;

READ ALL ADDRESSES EXPECTING 0 loadaddress %000000000;
    clearsig;
    read 512;
    readsig %00000111001110000000001010110101;

ALTERNATELY:
WRITE 11111111111111111111111111111111
INCREMENT ADDRESS

READ EXPECTING 00000000000000000000000000000000 loadwritelatch %11111111111111111111111111111111;
    loadaddress %000000000;
    clearsig;
    writeread 511;
    readsig %10001110101101111011100100010110;

ALTERNATELY:
WRITE 00000000000000000000000000000000
INCREMENT ADDRESS
READ EXPECTING 11111111111111111111111111111111 loadwritelatch %00000000000000000000000000000000;
    loadaddress %000000000;
    clearsig;
    writeread 511;
    readsig %11010011110101011001000101011;

ALTERNATELY:
WRITE 11111111111111111111111111111111;
DECREMENT ADDRESS
READ EXPECTING 00000000000000000000000000000000 loadincrement %111111111;
    loadwritelatch %11111111111111111111111111111111;
    loadaddress %111111111;
    clearsig;
    writeread 511;
    readsig %10001110101101111011100100010110;

ALTERNATELY:
WRITE 00000000000000000000000000000000
DECREMENT ADDRESS
READ EXPECTING 11111111111111111111111111111111 loadwritelatch %00000000000000000000000000000000;
    loadaddress %111111111;
    clearsig;
    writeread 511;
    readsig %11010011110101011001000101011;

WRITE 10101010... TO ALL ADDRESSES loadincrement %000000001;
    loadaddress %000000000;
    loadwritelatch %10101010101010101010101010101010;
    clearsig;
    write 512;

read %1000000111001110000110000001101011;

ALTERNATELY:
WRITE 0101010101010101010101010101010101
INCREMENT ADDRESS
READ EXPECTING 1010101010101010101010101010 loadwritelatch %01010101010101010101010101010101;
    loadaddress %000000000;
    clearsig;
    writeread 511;
    readsig %0011100100000000000111010100001;

ALTERNATELY:
WRITE 1010101010101010101010101010
INCREMENT ADDRESS
READ EXPECTING 0101010101010101010101010101 loadwritelatch %10101010101010101010101010101010;
    loadaddress %000000000;
    clearsig;
    writeread 511;
    readsig %01100100010111010101001111111100;

ALTERNATELY:
WRITE 0101010101010101010101010101
DECREMENT ADDRESS
READ EXPECTING 1010101010101010101010101010 loadincrement %11111111;
    loadwritelatch %01010101010101010101010101010101;
    loadaddress %111111111;
    clearsig;
    writeread 511;
    readsig %0011100100000000000111010100001;

ALTERNATELY:
WRITE 1010101010101010101010101010
DECREMENT ADDRESS
READ EXPECTING 0101010101010101010101010101 loadwritelatch %10101010101010101010101010101010;
    loadaddress %111111111;
    clearsig;
    writeread 511;
    readsig %01100100010111010101001111111100;

WRITE 11001100110011001100110011001100 TO ALL ADDRESSES

```
loadincrement %000000001;
loadaddress %000000000;
loadwritelatch %1100110011001100110011001100;
clearsig;
write 512;
readsig %10000011100111000011000001101011;
```

ALTERNATELY:
WRITE 0011001100110011001100110011
INCREMENT ADDRESS
READ EXPECTING 1100110011001100110011001100

```
loadwritelatch %0011001100110011001100110011;
loadaddress %000000000;
clearsig;
writeread 511;
readsig %0101010001101101011000111001100;
```

ALTERNATELY:
WRITE 1100110011001100110011001100
INCREMENT ADDRESS
READ EXPECTING 0011001100110011001100110011

```
loadwritelatch %1100110011001100110011001100;
loadaddress %000000000;
clearsig;
writeread 511;
readsig %00001001001100000011110100100001;
```

ALTERNATELY:
WRITE 0011001100110011001100110011
DECREMENT ADDRESS
READ EXPECTING 1100110011001100110011001100

```
loadincrement %111111111;
loadwritelatch %0011001100110011001100110011;
loadaddress %111111111;
clearsig;
writeread 511;
readsig %0101010001101101011000111001100;
```

ALTERNATELY:
WRITE 1100110011001100110011001100
DECREMENT ADDRESS
READ EXPECTING 0011001100110011001100110011

```
loadwritelatch %1100110011001100110011001100;
loadaddress %111111111;
clearsig;
``` writeread 511;
readsig %00001001001100000011111010010001;

WRITE 111100001111000011110000111110000 TO ALL ADDRESSES loadincrement %000000001;
    loadaddress %000000000;
    loadwritelatch %11110000111100001111000011110000;
    clearsig;
    write 512;
    readsig %10000011100111000011000001101011;

ALTERNATELY:
WRITE 00001111000011110000111100001111
INCREMENT ADDRESS
READ EXPECTING 11110000111100001111000011110000 loadwritelatch %00001111000011110000111100001111;
    loadaddress %000000000;
    clearsig;
    writeread 511;
    readsig %11111000110000011100111101100000;

ALTERNATELY:
WRITE 11110000111100001111000011110000
INCREMENT ADDRESS
READ EXPECTING 00001111000011110000111100001111 loadwritelatch %11110000111100001111000011110000;
    loadaddress·%000000000;
    clearsig;
    writeread 511;
    readsig %10100101100111001001001000111101;

ALTERNATELY:
WRITE 00001111000011110000111100001111
DECREMENT ADDRESS
READ EXPECTING 11110000111100001111000011110000 loadincrement %111111111;
    loadwritelatch %00001111000011110000111100001111;
    loadaddress %111111111;
    clearsig
    writeread 511;
    readsig %11111000110000011100111101100000;

ALTERNATELY:
WRITE 11110000111100001111000011110000

DECREMENT ADDRESS
READ EXPECTING 00001111000011110000111100001111 loadwritelatch %11110000111100001111000011110000;
    loadaddress %111111111;
    clearsig;
    writeread 511;
    readsig %101001011001110010010010000111101;

WRITE 111111110000000011111111000000000 TO ALL ADDRESSES loadincrement %000000001;
    loadaddress %000000000;
    loadwritelatch %111111110000000011111111000000000;
    clearsig;
    write 512;
    read %100000111001110000110000001101011;

ALTERNATELY:
WRITE 000000001111111100000000011111111
INCREMENT ADDRESS
READ EXPECTING 111111110000000011111111100000000 loadwritelatch %000000001111111100000000011111111;
    loadaddress %000000000;
    clearsig;
    writeread 511;
    readsig %111010001101110011110100001011010;

ALTERNATELY:
WRITE 111111110000000011111111100000000
INCREMENT ADDRESS
READ EXPECTING 000000001111111100000000011111111 loadwritelatch %111111110000000011111111100000000;
    loadaddress %000000000;
    clearsig;
    writeread 511;
    readsig %101101011011001100100111010010011;

ALTERNATELY:
WRITE 000000001111111100000000011111111
DECREMENT ADDRESS
READ EXPECTING 111111110000000011111111100000000 loadincrement %111111111;
    loadwritelatch %000000001111111100000000011111111;
    loadaddress %111111111;
    clearsig;

writeread 511;
readsig %11101000111011100011101000010110;

ALTERNATELY:
WRITE 1111111100000000111111100000000
DECREMENT ADDRESS
READ EXPECTING 00000000111111100000000111111111 loadwritelatch %11111111000000001111111100000000;
    loadaddress %111111111;
    clearsig;
    writeread 511;
    readsig %10110101101100110010011101001011;

WRITE 11111111111111110000000000000000 TO ALL ADDRESSES loadincrement %000000001;
    loadaddress %000000000;
    loadwritelatch %11111111111111110000000000000000;
    clearsig;
    write 512;
    readsig %10000011001110000110000001101011;

ALTERNATELY:
WRITE 00000000000000001111111111111111
INCREMENT ADDRESS
READ EXPECTING 11111111111111110000000000000000 loadwritelatch %00000000000000001111111111111111;
    loadaddress %000000000;
    clearsig;
    writeread 511;
    readsig %00010100011101001011100100010110;

ALTERNATELY:
WRITE 11111111111111110000000000000000
INCREMENT ADDRESS
READ EXPECTING 00000000000000001111111111111111 loadwritelatch %11111111111111110000000000000000;
    loadaddress %000000000;
    clearsig;
    writeread 511;
    readsig %01001001001010011100100010011011;

ALTERNATELY:
WRITE 00000000000000001111111111111111
DECREMENT ADDRESS
READ EXPECTING 11111111111111110000000000000000

```
loadincrement %111111111;
loadwritelatch %000000000000000011111111111111;
loadaddress %111111111;
clearsig;
writeread 511;
readsig %000101000111010010111100100010110;
```

ALTERNATELY:
WRITE 11111111111111110000000000000000
DECREMENT ADDRESS
READ EXPECTING 00000000000000001111111111111111

```
loadwritelatch %11111111111111110000000000000000;
loadaddress %11111111;
clearsig;
writeread 511;
readsig %010010010010100111100100010001011;
```

BEGIN PRE-CHARGE TEST

WRITE ZERO TO ALL ADDRESSES

```
loadincrement %000000001;
loadaddress %000000000;
loadwritelatch %00000000000000000000000000000000;
write 512;
```

INCREMENTING BY 4 (from address 0)
WRITE 11111111111111111111111111111111
INCREMENT ADDRESS
READ EXPECTING 00000000000000000000000000000000

```
loadincrement %00000000100;
loadaddress %000000000;
loadwritelatch %11111111111111111111111111111111;
clearsig;
writeread 8;
readsig %01001101001110011100010101001011;
```

INCREMENTING BY 4 (from address 1)
WRITE 11111111111111111111111111111111
INCREMENT ADDRESS
READ EXPECTING 00000000000000000000000000000000

```
loadincrement %000000100;
loadaddress %000000001;
loadwritelatch %11111111111111111111111111111111;
``` clearsig;
writeread 8;
readsig %01001101001110011100101011001011;

INCREMENTING BY 4 (from address 2)
WRITE 11111111111111111111111111111111
INCREMENT ADDRESS
READ EXPECTING 00000000000000000000000000000000 loadincrement %000000100;
    loadaddress %000000010;
    loadwritelatch %11111111111111111111111111111111;
    clearsig;
    writeread 8;
    readsig %01001101001110011100101011001011;

INCREMENTING BY 4 (from address 3)
WRITE 11111111111111111111111111111111
INCREMENT ADDRESS
READ EXPECTING 00000000000000000000000000000000 loadincrement %000000100;
    loadaddress %000000011;
    loadwritelatch %11111111111111111111111111111111;
    clearsig;
    writeread 8;
    readsig %01001101001110011100101011001011;

INCREMENTING BY 4 (from address 0)
WRITE 00000000000000000000000000000000
INCREMENT ADDRESS
READ EXPECTING 11111111111111111111111111111111 loadincrement %000000100;
    loadaddress %000000000;
    loadwritelatch %00000000000000000000000000000000;
    clearsig;
    writeread 8;
    readsig %01001101001010011110100101001011;

INCREMENTING BY 4 (from address 1)
WRITE 00000000000000000000000000000000
INCREMENT ADDRESS
READ EXPECTING 11111111111111111111111111111111 loadincrement %000000100;
    loadaddress %000000001;
    loadwritelatch %00000000000000000000000000000000;
    clearsig;

writeread 8;
readsig %01001101001010011110100101001011;

INCREMENTING BY 4 (from address 2)
WRITE 000000000000000000000000000000
INCREMENT ADDRESS
READ EXPECTING 111111111111111111111111111111 loadincrement %000000100;
    loadaddress %000000010;
    loadwritelatch %000000000000000000000000000000;
    clearsig;
    writeread 8;
    readsig %01001101001010011110100101001011;

INCREMENTING BY 4 (from address 3)
WRITE 000000000000000000000000000000
INCREMENT ADDRESS
READ EXPECTING 111111111111111111111111111111 loadincrement %000000100;
    loadaddress %000000011;
    loadwritelatch %000000000000000000000000000000;
    clearsig;
    writeread 8;
    readsig %01001101001010011110100101001011;

BEGIN P-FET TEST

* Turn-ON all leak FET's

WRITE ZERO TO ALL ADDRESSES loadincrement %000000001;
    loadaddress %000000000;
    loadwritelatch %000000000000000000000000000000;
    write 512;

READ ALL ADDRESSES EXPECTING 0 loadaddress %000000000;
    clearsig;
    read 512;
    readsig %00000111001110000000001010110101;

WRITE ONE TO ALL ADDRESSES

```
loadincrement %000000001;
loadaddress %111111111;
loadwritelatch %111111111111111111111111111111111
write 512;
```

READ ALL ADDRESSES EXPECTING 1

```
loadaddress %000000000; 1
clearsig;
read 512;
readsig %0010011100111000001100101011010l;
```

* Turn-OFF all leak FET's endtest;

With this configurable self-test, a chip can be tested at speed, the test can easily be modified in production, no special tester hardware is required, the test time is shortened because data is only scanned in and out at the end of a test segment rather than after each access, the test control uses the same output drivers as are used during normal operation, and conventional scanpath testing can be used when required for diagnostics.

The preferred embodiment described above is for application with a single-port RAM. Obviously, the invention has equal application to a multi-port RAM, although the exact test will depend on how the ports are used in the chip. For example, with a two-port RAM (i.e., a RAM having a read-write port and a read-only port), two signature generators would be used. The test sequence provided above for the single-port RAM could be used for the read-write port of the two-port RAM. The second signature generator could be coupled with the read-only port. The read-only port could then read the same addresses as the read-write port, however, it would be done one half clock cycle behind the read-write port (i.e., the read-only port could be clocked by a clock inverted to the read-write clock). The half-cycle delay would eliminate the potential of receiving an ambiguous read caused by reading during a write.

Although the invention has been described and illustrated with a certain degree of particularity, it is understood that those skilled in the art will recognize a variety of applications and appropriate modifications within the spirit of the invention and the scope of the claims.

What is claimed is:

1. A self-test circuit for a RAM embedded in an integrated circuit chip, the self-test circuit adapted to interface with a tester and to receive a test vector therefrom, said self-test circuit comprising:
   (a) an address register associated with the RAM, said address register having a normal operation mode and a test mode, said address register being adapted to store a RAM address and to automatically increment said RAM address by an address increment upon receiving an increment signal;
   (b) a control circuit associated with the RAM, said control circuit having a normal operation mode and a test mode, said control circuit being adapted to coordinate RAM read/write operations and to produce said increment signal;
   (c) a write register associated with the RAM for storing test data to be written to the RAM, said test data comprising non-random data sequences designed to detect faults of predetermined types;
   (d) a signature generator associated with the RAM and adapted to receive data read from the RAM, and to produce a test signature in response thereto; and
   (e) a scanpath allowing access to said incrementable address register, said control circuit, said write register, and said signature generator, said scanpath allowing data to be shifted into and out of said incrementable address register, said control circuit, said write register, and said signature generator.

2. The self-test circuit of claim 1, wherein said test mode includes performing a read of the contents of the RAM at said RAM address.

3. The self-test circuit of claim 1, wherein said test mode includes performing a write to the RAM at said RAM address.

4. The self-test circuit of claim 1, wherein said test mode includes performing alternating reads from the RAM and writes to the RAM.

5. The self-test circuit of claim 1, wherein said signature generator is a polynomial signature analyzer.

6. The self-test circuit of claim 4, further comprising: a read register adapted to receive data read from the RAM.

7. A method for testing a RAM, said method comprising the steps of:
   (a) scanning a RAM address through a scanpath into an address register having a normal operation mode and a test mode;
   (b) scanning a control pattern through a scanpath into a control circuit having a normal operation mode and a test mode;
   (c) scanning a data pattern into a write register through said scanpath, said data pattern comprising non-random data sequences designed to detect faults of predetermined types;
   (d) performing a write of said data pattern to said RAM at said RAM address, or a read of a contents of the RAM at said RAM address;

(e) incrementing said RAM address in said address register by an address increment; and (f) iteratively repeating steps (d) and (e) for a desired number of RAM addresses.

8. The method of claim 7, wherein all reads are performed at step (d).

9. The method of claim 7, wherein all writes are performed at step (d).

10. The method of claim 7, wherein in step (f) while iteratively repeating steps (d) and (e), said write of said data pattern and said real of said RAM contents are alternatively performed during iterations of step (d).

11. The method of claim 7, further comprising a step:
(g) processing each said contents of the RAM read from said RAM address in a signature generator to produce a test signature.

12. The method of claim 11, further comprising a step:
(h) scanning said test signature out of said signature generator through said scanpath.

* * * * *

UNITED STATES PATENT AND TRADEMARK OFFICE
CERTIFICATE OF CORRECTION

PATENT NO. : 5,301,156
DATED : April 5, 1994
INVENTOR(S) : Harlan A. Talley

It is certified that error appears in the above-identified patent and that said Letters Patent is hereby corrected as shown below:

Column 32, line 1, Claim 10: After "said" (first occurence) delete "real" and insert therefor --read--.

Signed and Sealed this

Seventh Day of April, 1998

Attest:

BRUCE LEHMAN

Attesting Officer

Commissioner of Patents and Trademarks